United States Patent
Karkhanis

(10) Patent No.: US 9,847,782 B2
(45) Date of Patent: Dec. 19, 2017

(54) PUSH OR SLIDE TYPE CAPACITOR SWITCH

(71) Applicant: Sanjay Dinkar Karkhanis, Pune (IN)

(72) Inventor: Sanjay Dinkar Karkhanis, Pune (IN)

(*) Notice: Subject to any disclaimer, the term of this patent is extended or adjusted under 35 U.S.C. 154(b) by 1 day.

(21) Appl. No.: 15/072,503

(22) Filed: Mar. 17, 2016

(65) Prior Publication Data

US 2016/0277024 A1    Sep. 22, 2016

Related U.S. Application Data

(60) Provisional application No. 62/135,896, filed on Mar. 20, 2015.

(51) Int. Cl.
  *G01R 27/26* (2006.01)
  *G06F 3/041* (2006.01)
  *G06F 3/045* (2006.01)
  *H03K 17/975* (2006.01)

(52) U.S. Cl.
  CPC .................. *H03K 17/975* (2013.01)

(58) Field of Classification Search
  CPC .................................. H03K 17/975
  USPC .................. 324/663, 681; 345/173, 174
  See application file for complete search history.

(56) References Cited

U.S. PATENT DOCUMENTS

2006/0017533 A1* 1/2006 Jahnes ............... H01H 59/0009
                                                           335/78
2010/0181180 A1* 7/2010 Peter .................... H03K 17/955
                                                           200/5 R

* cited by examiner

*Primary Examiner* — Farhana Hoque
(74) *Attorney, Agent, or Firm* — Sand & Sebolt

(57) ABSTRACT

A switch is envisaged in the present disclosure. The switch includes a plunger that has one of a push action and a slide action to actuate the switch. The plunger is at least partially attached to a conductive pill. The switch includes a pair of sense electrodes, each having a first operative surface to which a dielectric film is attached forming an operational capacitor, and a second operative surface which is in electrical contact with the operational capacitor. The operational capacitor has a parallel relationship with an external capacitor when the conductive pill makes contact with the dielectric film resulting in discharge of the external capacitor. The microprocessor includes an internal capacitor that discharges on discharge of the external capacitor. Charge across the internal capacitor is monitored and compared with a pre-defined threshold value by the microprocessor to activate/deactivate the switch.

12 Claims, 4 Drawing Sheets

PUSH OR SLIDE TYPE CAPACITOR SWITCH

FIELD

The present disclosure relates to the field of electronics, particularly to the field of switches.

DEFINITIONS

As used in the present disclosure, the following term is generally intended to have the meaning as set forth below, except to the extent that the context in which it is used to indicate otherwise.

The term 'bounce' used hereinafter in the disclosure refers to a tendency of any two metal contacts in an electronic device to generate multiple signals as the contacts close or open.

The term 'conductive pill' used hereinafter in the disclosure refers to a film made of a conductive material. The conductive pill can be of different shapes including circular, polygonal and any combinations thereof.

This definition is in addition to those expressed in the art.

BACKGROUND

Touch button switches commonly require the use of glass or plastic as a dielectric material. Touch buttons carry certain disadvantages including accidental switching during false touches. Occurrence of bounce effect is prevalent in case of mechanical switches. The mechanical switches are also prone to damage due to periodic wear and tear. Replacing/repairing touch button switches and mechanical switches is quite expensive.

Hence, there is felt a need for a switch which limits the aforementioned drawbacks of the conventional touch button switches as well as mechanical switches.

OBJECTS

Some of the objects of the present disclosure, which at least one embodiment herein satisfies, are as follows:

An object of the present disclosure is to provide a switch that avoids accidental triggers caused due to false touches in conventional capacitive switches.

An object of the present disclosure is to provide a switch which behaves like a mechanical switch without occurrence of bounce de-bounce effect or wear and tear of the mechanical contacts during its operation.

Another object of the present disclosure is to provide a switch adapted for capacitor switch technology.

Yet another object of the present disclosure is to provide a push button capacitor switch technology which increases the life span and the reliability of the switch.

Further, an object of the present disclosure is to provide a switch that avoids the bounce effect.

Furthermore, an object of the present disclosure is to provide a switch which can be retrofitted in existing switching systems.

Still further object of the present disclosure is to provide a switch which has an increased lifespan.

Other objects and advantages of the present disclosure will be more apparent from the following description when read in conjunction with the accompanying figures, which are not intended to limit the scope of the present disclosure.

SUMMARY

The present disclosure envisages a switch which is defined by a plunger, a conductive pill, a pair of sense electrodes, a dielectric film, an operational capacitor, an external capacitor, and a microprocessor. The plunger has one of a push action and a slide action to actuate the switch, and is at least partially attached to the conductive pill. Each electrode of the pair of sense electrodes has a first operative surface and a second operative surface. The dielectric film is attached to each of the first operative surface of the pair of sense electrodes to form the operational capacitor. The operational capacitor forms an electrical contact with each of the second operative surfaces of the pair of sense electrodes, thereby enabling the operational capacitor to be in parallel relationship with the external capacitor when the conductive pill makes contact with the dielectric film causing discharge of the external capacitor. The microprocessor includes an internal capacitor that cooperates with the external capacitor and discharges on discharge of the external capacitor. The microprocessor monitors the charge across the internal capacitor, and compares value of the monitored charge with a pre-defined threshold value to activate/deactivate the switch.

In an embodiment, the switch is activated when the value of the monitored charge falls below the threshold value. In one embodiment, the microprocessor includes a comparator to compare the monitored charge with the pre-defined threshold value. In another embodiment, the conductive pill is attached to the plunger by adhesives made of materials selected from a group of acrylic, silicone and any combinations thereof. Further, the plunger is made of an insulating material. Furthermore, in an embodiment, the dielectric film is a polyester film with acrylic gumming at one end. In yet another embodiment, the dielectric film is an epoxy masking on a printed circuit board. The conductive pill present in the switch is made of a material selected from a group consisting of silver, carbon, gold, nickel, silicon, polybutadiene, nylon polymer, polymer styrene and any combinations thereof, in accordance with an envisaged embodiment.

In a further embodiment, the shape of the sense electrodes is determined on the distance between the sense electrodes, size and shape of a keyboard having keys which use the switch of the present disclosure, and key distance to be maintained by the keys. The dielectric film prevents the plunger from making physical contact with the pair of sense electrodes. In one embodiment, the plunger is actuated with the help of a key made of silicon rubber/plastic, and/or a spring.

BRIEF DESCRIPTION OF ACCOMPANYING DRAWING

The switch of the present disclosure will now be described with the help of the accompanying drawing, in which.

DETAILED DESCRIPTION

Figure 1:
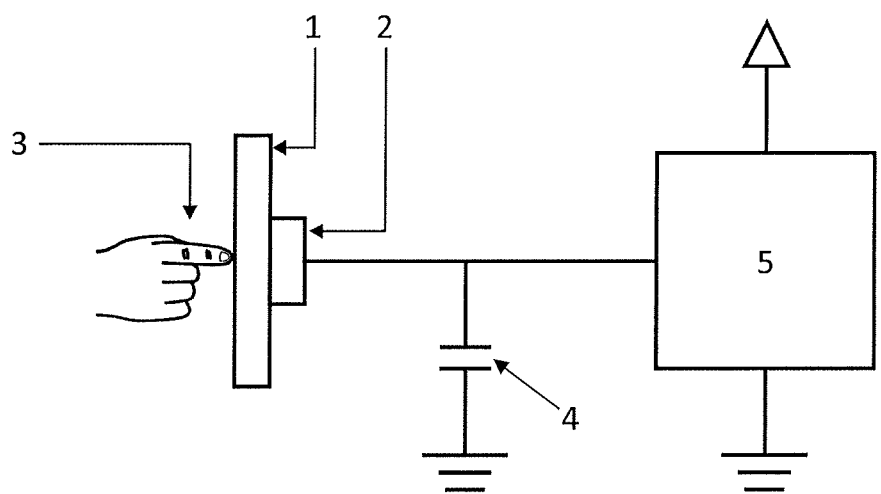
FIG. 1 illustrates a schematic diagram of a conventional touch type switch in accordance with an embodiment of the prior art.

Accidental switching, occurrence of bounce effects, and damage due to periodic wear and tear, are some of the drawbacks of the conventional capacitive and mechanical switches. Referring to the accompanying drawing, FIG. 1 illustrates a schematic diagram of a conventional switch in accordance with an embodiment of prior art. It is a touch type capacitor switch that has dielectric materials (like plastic or glass) which are used between two electrodes 2 and 3. The electrode 2 is human sensing type of electrode. The capacitive sensors work by mere touch of finger to the dielectric materials when they are part of a capacitor 1. This makes the capacitor 1 to be in parallel configuration with an external capacitor 4. By touching the capacitor 1 with a finger, the charge across the capacitor 4 is reduced. A microprocessor 5 recognizes this reduced charge and the switch gets operated. Some of the disadvantages associated with the traditional touch button switches include accidental triggering due to false touch. The mechanical switches are also prone to damage due to periodic wear and tear. Replacing/repairing touch button switches and mechanical switches can be expensive. To limit the above mentioned drawbacks of the conventional capacitive and mechanical switches, a switch is envisaged in the present disclosure which is herein described with the help of the accompanying drawing.

Figure 2:
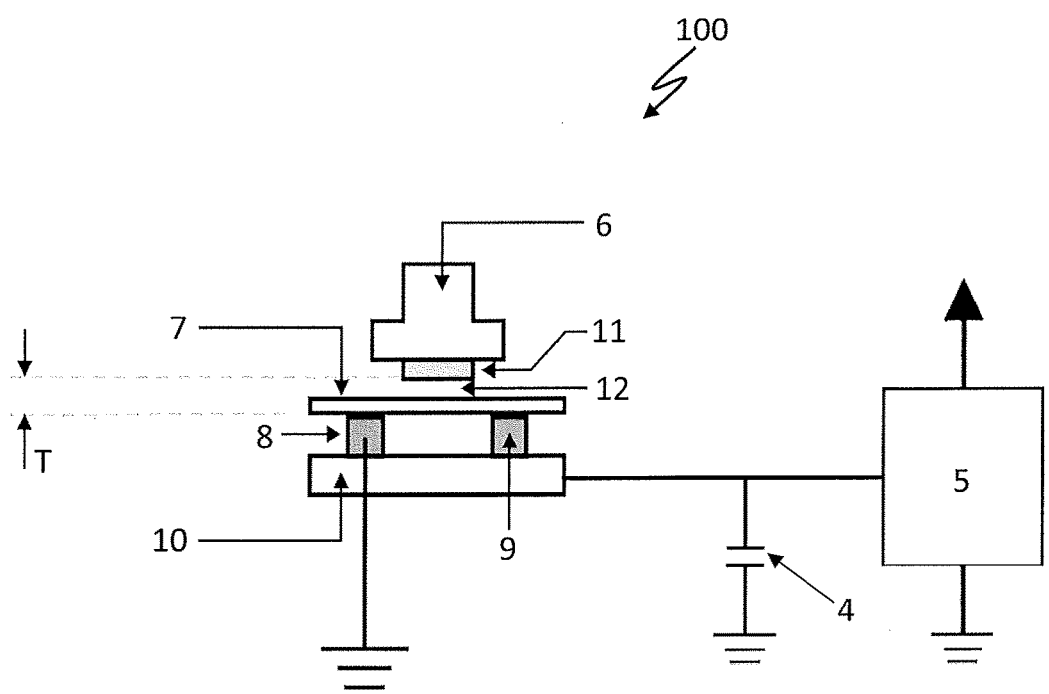
FIG. 2 illustrates a schematic diagram for a switch in accordance with an embodiment of the present disclosure.
Figure 3A:
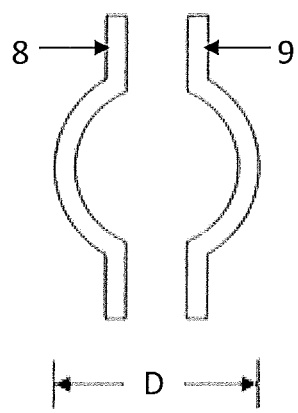
FIG. 3a illustrates a front view of a pair of sense electrodes for the switch of FIG. 2 in accordance with one embodiment of the present disclosure.
Figure 3B:
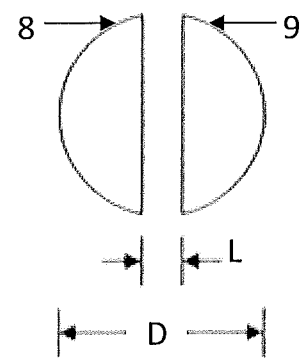
FIG. 3b illustrates a front view of another pair of sense electrodes for the switch of FIG. 2 in accordance with another embodiment of the present disclosure.
Figure 3C:
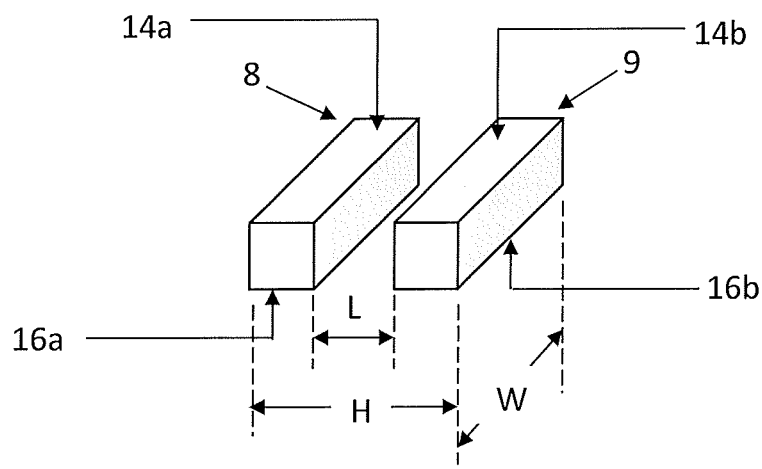
FIG. 3c illustrates an isometric view of yet another pair of sense electrodes for the switch of FIG. 2 in accordance with yet another embodiment of the present disclosure.
Figure 3D:
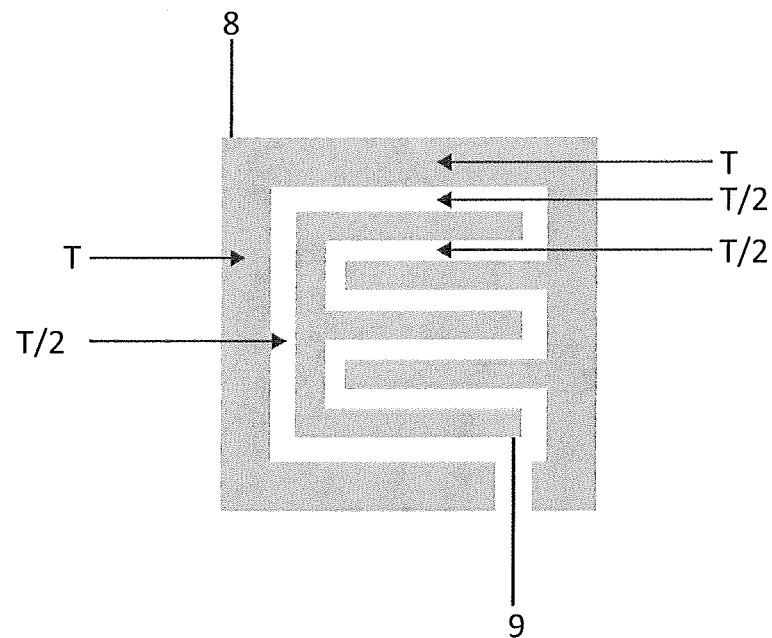
FIG. 3d illustrates a front view of one more pair of sense electrodes for the switch of FIG. 2 in accordance with still another embodiment of the present disclosure.
Figure 3E:
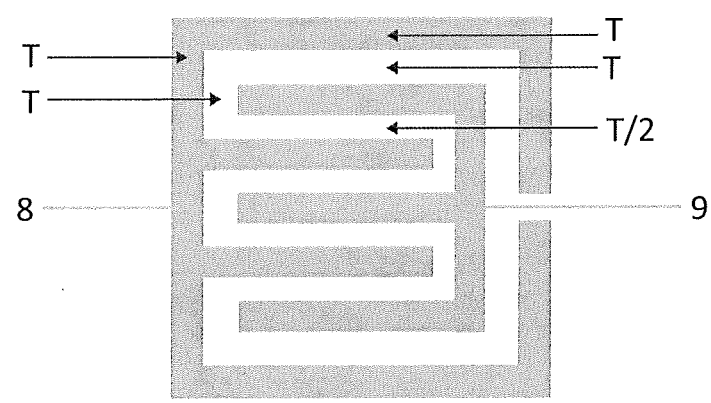
FIG. 3e illustrates a front view of still one more pair of sense electrodes for the switch of FIG. 2 in accordance with one more embodiment of the present disclosure.

FIG. 2 of the accompanying drawing illustrates a schematic diagram of a switch 100 in accordance with an embodiment of the present disclosure. FIGS. 3a to 3e illustrate different views of the pair of sense electrodes for the switch of FIG. 2 in different embodiments. The switch 100 introduced in the present disclosure includes a plunger 6 which is functionally configured with a conductive pill 11. The conductive pill 11 is at least partially attached to the plunger 6. The switch 100 also includes a pair of sense electrodes 8 and 9, a dielectric film 7, an operational capacitor 10, an external capacitor 4 and a microprocessor 5. The sense electrodes 8 and 9, each have a first operative surface 14a and 14b respectively and a second operative surface 16a and 16b respectively. The dielectric film 7 is attached to each of the first operative surfaces 14a and 14b to form the operational capacitor 10. The operational capacitor 10 is disposed in an electrical contact with each of the second operative surfaces 16a and 16b, such that when the plunger 6 is actuated, the conductive pill 11 makes contact with the dielectric film 7 thereby causing the operational capacitor 10 to be in a parallel relationship with the external capacitor 4. The microprocessor 5 includes an internal capacitor (not shown in the figures) which is parallel to the external capacitor 4. Thus, when the conductive pill 11 makes contact with the dielectric film 7, the charge across the operational capacitor 10 decreases, causing a decrease in the charge of the external capacitor 4 which in turn decreases the charge across the internal capacitor. The microprocessor 5 monitors this charge across the internal capacitor, and compares the value of the monitored charge with a pre-defined threshold value to activate/deactivate the switch 100. The switch 100 is activated when the monitored charge decreases below the threshold value, i.e., when the value of the monitored charge falls below the threshold value.

With the actuation of the plunger 6 which may be one of a push action and a slide action, the plunger 6 comes close to the pair of sense electrodes 8 and 9. The dielectric film 7 present between the sense electrodes 8 and 9 prevents the plunger 6 from making contact with the sense electrodes 8 and 9. This actuation decreases the charge which is recognized by the microprocessor 5 to activate the switch 100. In one embodiment, the microprocessor 5 includes a comparator (not shown in the figures) which compares the recognized charge with the pre-defined threshold value to activate the switch 100. In an embodiment, the sense electrode 8 is grounded and the sense electrode 9 is connected to the microprocessor 5.

In one embodiment, the switch 100 has push-on/push-off configuration. In this embodiment, the plunger 6 is pushed/slid in order to activate/deactivate the switch 100. When the plunger 6 is pushed/slid for the first time (for switch ON), the conductive pill 11 makes contact with the dielectric film 7 which in turn decreases the charge across the internal capacitor based on which the microprocessor 5 activates the switch 100. The charge across the internal capacitor is maintained till the contact between the conductive pill 11 and the dielectric film 7 breaks. When the plunger 6 is pushed/slid for the second time (for switch OFF), the contact between the conductive pill 11 and the dielectric film 7 breaks, which facilitates charging of the internal capacitor. The microprocessor 5 detects the increased charge across the internal capacitor and deactivates the switch 100. In another embodiment, the switch 100 has a push to on configuration, wherein when the plunger 6 is pushed/slid, the switch 100 is activated and when the plunger 6 is released it returns to its normally open (off) position thereby de-activating the switch 100.

In an embodiment, the factors that affect the shape of the sense electrodes 8 and 9 include the distance between the sense electrodes L, size and shape of a keyboard having keys which use the switch 100, and key distance to be maintained by the keys. In one embodiment, an air column 12 is present between the conductive pill 11 and the dielectric film 7 and T represents total thickness of material that the plunger 6 must penetrate. In an embodiment, the distance between two terminals of the sense electrodes 8 and 9 is kept between 0.5 mm to 1.5 mm. In another embodiment, the outer diameter D or width W, and height H of the sense electrodes 8 and 9, and plunger diameter are decided and calculated so that a total capacitance formed by the switch 100 is more than 6 pF. Delay in charge burst is defined by the microprocessor 5 to which the switch 100 is connected. It is typically between 60 ms to 80 ms. In accordance with an embodiment, the dielectric film 7 is a polyester film with the acrylic gumming on one end and is 0.1 mm thick. In another embodiment, the dielectric film 7 is epoxy masking on PCB. In one embodiment, the plunger 6 is made of an insulating material and the conductive pill 11 is attached to the plunger 6 by adhesives made of materials selected from a group of acrylic, silicone and any combinations thereof. In yet another embodiment, the conductive pill 11 is selected from a group of materials including silver, carbon, gold, nickel, silicon, polybutadiene, nylon polymer, polymer styrene, and any combinations thereof. The material hardness is not greater than Hardness 60 degrees Shore A. In an embodiment, the plunger 6 movement is accomplished by using a definite silicon rubber shape (key) and/or a spring. The switch 100 of the present disclosure is free from accidental activation and takes care of the bounce effect.

TECHNICAL ADVANCEMENTS

The technical advancements offered by the present disclosure include the realization of:
- a switch that avoids accidental triggers caused due to false touches in conventional capacitive switches;
- a switch which behaves like a mechanical switch without occurrence of bounce de-bounce effect or wear and tear of the mechanical contacts during its operation;
- a switch adapted for a capacitor switch technology;
- a push button capacitor switch technology which increases life span and reliability of the switch;
- a switch that avoids a bounce effect;
- a switch which can be retrofitted to the existing switching systems; and
- a switch which has increased lifespan.

The disclosure described herein with reference to the accompanying embodiments does not limit the scope and ambit of the disclosure. The description provided is purely by way of example and illustration.

The embodiments herein and the various features and advantageous details thereof are explained with reference to the non-limiting embodiments in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The foregoing description of the specific embodiments so fully reveals the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

The use of the expression "at least" or "at least one" suggests the use of one or more elements or ingredients or quantities, as the use may be in the embodiment of the disclosure to achieve one or more of the desired objects or results.

Any discussion of documents, acts, materials, devices, articles or the like that has been included in this specification is solely for the purpose of providing a context for the disclosure. It is not to be taken as an admission that any or all of these matters form a part of the prior art base or were common general knowledge in the field relevant to the disclosure as it existed anywhere before the priority date of this application.

While considerable emphasis has been placed herein on the components and component parts of the preferred embodiments, it will be appreciated that many embodiments can be made and that many changes can be made in the preferred embodiments without departing from the principles of the disclosure. These and other changes in the preferred embodiment as well as other embodiments of the disclosure will be apparent to those skilled in the art from the disclosure herein, whereby it is to be distinctly understood that the foregoing descriptive matter is to be interpreted merely as illustrative of the disclosure and not as a limitation.

The invention claimed is:

1. A switch defined by:
   a plunger having one of a push action and a slide action to actuate said switch, said plunger at least partially attached to a conductive pill;
   a pair of sense electrodes, each having a first operative surface and a second operative surface, wherein:
   a dielectric film is attached to each of said first operative surface of said pair of sense electrodes to form an operational capacitor, such that said operational capacitor forms an electrical contact with each of said second operative surface of said pair of sense electrodes, thereby enabling said operational capacitor to be in a parallel relationship with an external capacitor when said conductive pill makes contact with said dielectric film causing discharge of said external capacitor; and
   a microprocessor having an internal capacitor configured to cooperate with said external capacitor to discharge said internal capacitor on discharge of said external capacitor, said microprocessor further configured to monitor the charge across said internal capacitor, and compare value of the monitored charge with a pre-defined threshold value to activate/deactivate said switch.

2. The switch as claimed in claim 1, which is activated when said value of the monitored charge falls below said threshold value.

3. The switch as claimed in claim 1, wherein said microprocessor includes a comparator to compare the monitored charge with the pre-defined threshold value.

4. The switch as claimed in claim 1, wherein said conductive pill is attached to said plunger by adhesives made of materials selected from a group of acrylic, silicone and any combinations thereof.

5. The switch as claimed in claim 1, wherein said plunger is made of an insulating material.

6. The switch as claimed in claim 1, wherein said dielectric film is a polyester film with acrylic gumming on one end.

7. The switch as claimed in claim 1, wherein said dielectric film is an epoxy masking on printed circuit board.

8. The switch as claimed in claim 1, wherein said conductive pill is made of a material selected from a group consisting of silver, carbon, gold, nickel, silicon, polybutadiene, nylon polymer, polymer styrene, and any combinations thereof.

9. The switch as claimed in claim 1, wherein shape of said sense electrodes is based on distance between the sense electrodes, size and shape of a keyboard having keys which use said switch, and key distance to be maintained by the keys.

10. The switch as claimed in claim 1, wherein said dielectric film prevents said plunger from making physical contact with said pair of sense electrodes.

11. The switch as claimed in claim 1, wherein said plunger is actuated with the help of a key made of silicon rubber/plastic, and/or a spring.

12. The switch as claimed in claim 1, wherein when the plunger is actuated, the conductive pill makes contact with the dielectric film thereby causing the operational capacitor to be in the parallel relationship with the external capacitor.

* * * * *